(12) United States Patent
Yoshioka et al.

(10) Patent No.: US 7,189,651 B2
(45) Date of Patent: Mar. 13, 2007

(54) STOPPER FOR CHEMICAL MECHANICAL PLANARIZATION, METHOD FOR MANUFACTURING SAME, AND CHEMICAL MECHANICAL PLANARIZATION METHOD

(75) Inventors: Mutsuhiko Yoshioka, Tokyo (JP); Eiji Hayashi, Tokyo (JP); Norihiko Ikeda, Tokyo (JP)

(73) Assignee: JSR Corporation, Tokyo (JP)

( * ) Notice: Subject to any disclaimer, the term of this patent is extended or adjusted under 35 U.S.C. 154(b) by 180 days.

(21) Appl. No.: 10/726,592

(22) Filed: Dec. 4, 2003

(65) Prior Publication Data

US 2004/0110379 A1 Jun. 10, 2004

(30) Foreign Application Priority Data

Dec. 6, 2002 (JP) ............... 2002-354528

(51) Int. Cl.
*H01L 21/302* (2006.01)

(52) U.S. Cl. ....................... 438/691; 438/692

(58) Field of Classification Search ........ 438/689–692; 252/79.1–79.5
See application file for complete search history.

(56) References Cited

U.S. PATENT DOCUMENTS

| | | | |
|---|---|---|---|
| 5,198,298 A | | 3/1993 | Haskell et al. |
| 5,602,060 A | | 2/1997 | Kobayashi et al. |
| 5,907,008 A | * | 5/1999 | Nakano et al. ............. 524/430 |
| 6,121,146 A | * | 9/2000 | Yoon et al. ................. 438/692 |
| 6,180,976 B1 | * | 1/2001 | Roy ............................ 257/306 |
| 6,225,238 B1 | | 5/2001 | Wu |
| 6,352,931 B1 | | 3/2002 | Seta et al. |
| 6,489,030 B1 | | 12/2002 | Wu et al. |
| 6,583,048 B1 | * | 6/2003 | Vincent et al. ............. 438/623 |
| 6,703,519 B1 | * | 3/2004 | Buvat et al. ................ 556/431 |
| 6,761,975 B1 | * | 7/2004 | Chen et al. ................. 428/429 |
| 2001/0019037 A1 | * | 9/2001 | Zakhidov et al. ............ 216/56 |
| 2002/0059899 A1 | | 5/2002 | Seta et al. |
| 2002/0142579 A1 | * | 10/2002 | Vincent et al. ............. 438/623 |
| 2004/0030170 A1 | * | 2/2004 | Levassort et al. ........... 556/425 |

FOREIGN PATENT DOCUMENTS

| | | | |
|---|---|---|---|
| JP | 7-90085 | | 4/1995 |
| JP | 7-102069 | | 4/1995 |
| JP | 9-143271 | | 6/1997 |
| JP | 10-120689 | | 5/1998 |
| JP | 10-204181 | | 8/1998 |
| JP | 11-29579 | | 2/1999 |
| JP | 11-158187 | | 6/1999 |
| WO | WO 01/19899 | * | 3/2001 |
| WO | WO 01/46963 | | 6/2001 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

A stopper for chemical mechanical planarization comprising an organosilicon polymer, in particular a polycarbosilane, is provided. The stopper used for polishing wafers with a wiring pattern in the manufacture of semiconductor devices to protect interlayer dielectric films made of a material such as $SiO_2$, fluorine dope $SiO_2$, or organic or inorganic SOG (Spin-on glass) from damages during the chemical mechanical planarization process.

8 Claims, 2 Drawing Sheets

STOPPER FOR CHEMICAL MECHANICAL PLANARIZATION, METHOD FOR MANUFACTURING SAME, AND CHEMICAL MECHANICAL PLANARIZATION METHOD

BACKGROUND OF THE INVENTION

1. Field of the Invention

The present invention relates to a stopper for chemical mechanical planarization. More particularly, the present invention relates to a stopper film used for polishing wafers with a wiring pattern in the manufacture of semiconductor devices (this polishing operation is herein referred to as "chemical mechanical planarization" which may be abbreviated from time to time as "CMP") to protect interlayer dielectric films made of a material such as $SiO_2$, fluorine dope $SiO_2$, or organic or inorganic SOG (Spin-on glass) from damages during the CMP process and to a method for chemical mechanical planarization using the stopper film.

2. Description of Background Art

Conventionally, aqueous type dispersion media containing inorganic particles of colloidal silica and colloidal alumina have been widely used as a polishing agent in CMP for polishing metal wiring, barrier membranes, and the like in semiconductor devices. Problems with the use of such aqueous type dispersion media in the CMP process are production of scratches in interlayer dielectric films and peeling of the films.

An object of the present invention is to solve these problems and to reduce damages to the interlayer dielectric films during the CMP process by laminating a specific film on the interlayer dielectric films.

SUMMARY OF THE INVENTION

The above object can be achieved in the present invention by a stopper for chemical mechanical planarization comprising an organosilicon polymer.

In a preferred embodiment of the present invention, the organosilicon polymer is a polycarbosilane.

In a further preferred embodiment of the present invention, the organosilicon polymer is at least one polymer selected from the group consisting of polymers having the structural unit of the following formula (1),

(1)

wherein $R^1$ and $R^2$ independently represent a hydrogen atom, an alkyl group having 1–30 carbon atoms that may have a substituent, an alkenyl group having 1–30 carbon atoms that may have a substituent, an alkynyl group having 1–30 carbon atoms that may have a substituent, or an aromatic group that may have a substituent and $R^3$ represents —C≡C—, —$CH_2$— that may have a substituent linked with at least one —C≡C— group, an alkylene group having 2–30 carbon atoms that may have a substituent linked with at least one —C≡C— group, an alkenylene group having 2–30 carbon atoms that may have a substituent linked with at least one —C≡C— group, an alkynylene group having 2–30 carbon atoms that may have a substituent linked with at least one —C≡C— group, or a divalent aromatic group having 2–30 carbon atoms that may have a substituent linked with at least one —C≡C— group.

The above-described object can also be achieved in the present invention by a coating solution for forming a stopper for chemical mechanical planarization comprising a polycarbosilane and an organic solvent.

The above-described object can be further achieved in the present invention by a method for producing a stopper for chemical mechanical planarization comprising applying a coating solution comprising (A) a polycarbosilane and (B) an organic solvent to a substrate and heating the coating.

The above-described object can be further achieved in the present invention by a chemical mechanical planarization method for removing a metallic film formed on an insulating film using a polishing solution characterized by providing a stopper for chemical mechanical planarization comprising polycarbosilane between the insulating film and metal film.

In the above chemical mechanical planarization method, the metallic film preferably comprises a first metal film of a barrier metal and a second metal film of copper, an alloy containing copper as a main component, or a copper compound.

The above-described object can be further achieved in the present invention by a chemical mechanical planarization method comprising forming a layer having an opening on a semiconductor region, the layer comprising an insulating film formed on the semiconductor region and a stopper for chemical mechanical planarization formed on insulating film, depositing a first metallic film of a barrier metal and a second metallic film of copper, an alloy containing copper as a main component, or a copper compound in the stopper for chemical mechanical planarization and the opening to fill the opening with the deposited metal films, and removing the second metallic film on the stopper for chemical mechanical planarization using a chemical mechanical planarization solution.

Other objects, features and advantages of the invention will hereinafter become more readily apparent from the following description.

Figure 1:
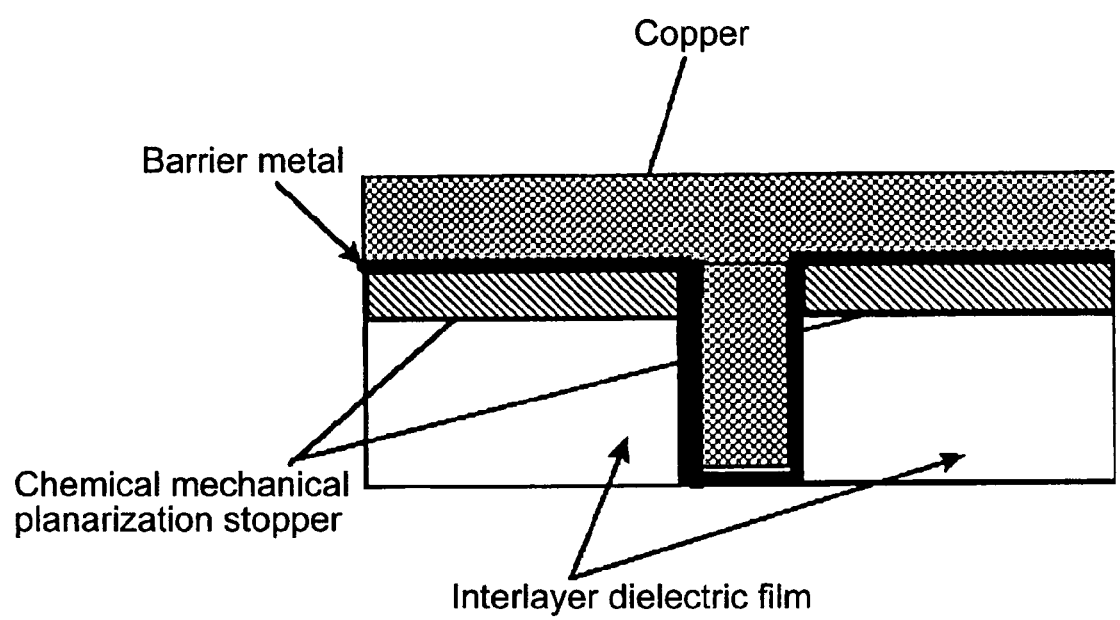
FIG. 1 shows a structure obtained by forming openings through a two-layer film consisting of an insulating film and a stopper for chemical mechanical planarization. A metal is then filled in the openings and layered over the chemical mechanical planarization stopper.

DETAILED DESCRIPTION OF THE INVENTION AND PREFERRED EMBODIMENTS (A) Organosilicon Polymer The stopper for CMP of the present invention comprises an organosilicon polymer having a relative dielectric constant of 4 or less.

Polycarbosilane having a relative dielectric constant of 4 or less, preferably 3.5 or less, can be given as such an organosilicon polymer.

A particularly preferable organosilicon polymer is a polymer (hereinafter referred to as "Polymer (1)") having a recurring unit of the following formula (1):

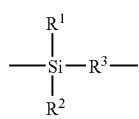

(1)

wherein R¹ and R² independently represent a hydrogen atom, an alkyl group having 1–30 carbon atoms that may have a substituent, an alkenyl group having 1–30 carbon atoms that may have a substituent, an alkynyl group having 1–30 carbon atoms that may have a substituent, or an aromatic group that may have a substituent and R³ represents —C≡C—, —CH₂— that may have a substituent linked with at least one —C≡C— group, an alkylene group having 2–30 carbon atoms that may have a substituent linked with at least one —C≡C— group, an alkenylene group having 2–30 carbon atoms that may have a substituent linked with at least one —C≡C— group, an alkynylene group having 2–30 carbon atoms that may have a substituent linked with at least one —C≡C— group, a divalent aromatic group having 2–30 carbon atoms that may have a substituent linked with at least one —C≡C— group.

As examples of the alkyl group having 1–30 carbon atoms that may have a substituent represented by R¹ or R², a methyl group, ethyl group, propyl group, hexyl group, cyclohexyl group, octyl group, dodecanyl group, trifluoromethyl group, 3,3,3-trifluoropropyl group, chloromethyl group, aminomethyl group, hydroxymethyl group, silylmethyl group, and 2-methoxyethyl group can be given; as examples of the alkenyl group having 1–30 carbon atoms that may have a substituent, a vinyl group, 2-propenyl group, isopropenyl group, 3-butenyl group, 5-hexenyl group, 1,3-buthadienyl group, and 3,3,3-trifluoro-1-propenyl group can be given; as examples of the alkynyl group having 1–30 carbon atoms that may have a substituent, an ethynyl group, 1-propynyl group, 2-propynyl group, butynyl group, trimethylsilylethynyl group, and phenylethynyl group can be given; and as examples of the aromatic group that may have a substituent, a phenyl group, naphthyl group, pyrazinyl group, 4-methylphenyl group, 4-vinylphenyl group, 4-ethynylphenyl group, 4-aminophenyl group, 4-chlorophenyl group, 4-hydroxyphenyl group, 4-carboxyphenyl group, 4-methoxyphenyl group, and 4-silylphenyl group can be given.

As examples of the —CH₂— group that may have a substituent linked with at least one —C≡C— group represented by R³, a methylene group and fluoromethylene group linked with one or two —C≡C— groups can be given; as examples of the alkylene group having 2–30 carbon atoms that may have a substituent linked with at least one —C≡C— group, an ethylene group, propylene group, tetramethylene group, and tetrafluoroethylene group linked with one or two —C≡C— groups can be given; as examples of the alkenylene group that having 2–30 carbon atoms may have a substituent linked with at least one —C≡C— group, a vinylene group, propenylene group, and butadienylene group linked with one or two —C≡C— groups can be given; as examples of the alkynylene group having 2–30 carbon atoms that may have a substituent linked with at least one —C≡C— group, an ethynylene group, propynylene group, and butynylene group linked with one or two —C≡C— groups can be given; and as examples of the aromatic group that may have a substituent linked with at least one —C≡C— group, a phenylene group, naphthylene group, biphenylene group, anthracenylene group, pyridilene group, thiophenylene group, fluorophenylene group, chlorophenylene group, methylphenylene group, silylphenylene group, hydroxyphenylene group, aminophenylene group, Phenylene methylene phenylene group, phenylene oxy phenylene group, phenylene propylidene phenylene group, and phenylene(hexafluoropropylidene)phenylene group linked with one or two —C≡C— groups can be given.

The organosilicon polymer represented by the formula (1) used in the present invention is specifically a compound having the following recurring units:
silylene-ethynylene,
methylsilylene-ethynylene,
phenylsilylene-ethynylene,
silylene-ethynylene-1,3-phenylene-ethynylene,
silylene-ethynylene-1,4-phenylene-ethynylene,
silylene-ethynylene-1,2-phenylene-ethynylene,
methylsilylene-ethynylene-1,3-phenylene-ethynylene,
methylsilylene-ethynylene-1,4-phenylene-ethynylene,
methylsilylene-ethynylene-1,2-phenylene-ethynylene,
dimethylsilylene-ethynylene-1,3-phenylene-ethynylene,
dimethylsilylene-ethynylene-1,4-phenylene-ethynylene,
dimethylsilylene-ethynylene-1,2-phenylene-ethynylene,
diethylsilylene-ethynylene-1,3-phenylene-ethynylene,
phenylsilylene-ethynylene-1,3-phenylene-ethynylene,
phenylsilylene-ethynylene-1,4-phenylene-ethynylene,
phenylsilylene-ethynylene-1,2-phenylene-ethynylene,
diphenylsilylene-ethynylene-1,3-phenylene-ethynylene,
hexylsilylene-ethynylene-1,3-phenylene-ethynylene,
vinylsilylene-ethynylene-1,3-phenylene-ethynylene,
ethynylsilylene-ethynylene-1,3-phenylene-ethynylene,
2-propenylsilylene-ethynylene-1,3-phenylene-ethynylene,
2-propynylsilylene-ethynylene-1,3-phenylene-ethynylene,
trifluoromethylsilylene-ethynylene-1,3-phenylene-ethynylene,
3,3,3-trifluoropropylsilylene-ethynylene-1,3-phenylene-ethynylene,
4-methylphenylsilylene-ethynylene-1,3-phenylene-ethynylene,
4-vinylphenylsilylene-ethynylene-1,3-phenylene-ethynylene,
4-ethynylphenylsilylene-ethynylene-1,3-phenylene-ethynylene,
phenylethynylsilylene-ethynylene-1,3-phenylene-ethynylene, silylene-ethynylene(5-methyl-1,3-phenylene) ethynylene, phenylsilylene-ethynylene(5-methyl-1,3-phenylene)-ethynylene, phenylsilylene-ethynylene(5-silyl-1,3-phenylene)ethynylene,
phenylsilylene-ethynylene(5-hydroxy-1,3-phenylene)-ethynylene,
phenylsilylene-ethynylene-2,7-naphthylene-ethynylene,
silylene-ethynylene-5,10-anthracenylene-ethynylene,
phenylsilylene-ethynylene-4,4'-biphenylene-ethynylene,
phenylsilylene-ethynylene-1,4-phenylenemethylene-1',4'-phenylene-ethynylene,
phenylsilylene-ethynylene-1,4-phenylene-2,2-propylidene-1',4'-phenylene-ethynylene,
phenylsilylene-ethynylene-1,4-phenylene-2,2-(1,1,1,3,3,3-hexafluoropropylidene)-1',4'-phenylene-ethynylene,
phenylsilylene-ethynylene-1,4-phenyleneoxy-1',4'-phenylene-ethynylene,
phenylsilylene-ethynylene-2,5-pyridilene-ethynylene,
phenylsilylene-ethynylene-2,5-thiophenylene-ethynylene,
methylsilylene-ethynylene methylene-ethynylene,
phenylsilylene-1,4-phenylene(phenylsilylene)ethynylene-1',3'-phenylene-ethylynylene, phenylsilyleneoxy(phenylsilylene)ethynylene,
phenylsilyleneoxy(phenylsilylene)ethynylene-1',4'-phenylene-ethynylene,
phenylsilyleneimino(phenylsilylene)ethynylene-1',3'-phenylene-ethynylene,
phenylsilyleneimino(phenylsilylene)ethynylene-1', 4'-phenylene-ethynylene,
silylene-1,3-phenylene-ethynylene,
silylene-1,4-phenylene-ethynylene,
silylene-1,2-phenylene-ethynylene,
phenylsilylene-1,3-phenylene-ethynylene,
phenylsilylene-1,4-phenylene-ethynylene,
phenylsilylene-1,2-phenylene-ethynylene,
diphenylsilylene-1,3-phenylene-ethynylene,
methylsilylene-1,3-phenylene-ethynylene,
methylsilylene-1,4-phenylene-ethynylene,
methylsilylene-1,2-phenylene-ethynylene,
dimethylsilylene-1,3-phenylene-ethynylene,
diethylsilylene-1,3-phenylene-ethynylene,
phenylsilylene-1,3-phenylene-butadiylene,
diphenylsilylene-1,3-phenylene-butadiylene,
phenylsilylene-methylene-ethynylene,
diphenylsilylene-methylene-ethynylene-methylene,
phenylsilylene-methylene-ethynylene-methylene, silylene-1,4-phenylene-ethynylene-1',4'-phenylene,
methylsilylene-1,4-phenylene-ethynylene-1',4'-phenylene,
dimethylsilylene-1,4-phenylene-ethynylene-1',4'-phenylene, and
phenylsilylene-1,4-phenylene-ethynylene-1',4'-phenylene.

Although there are no specific limitations, the average molecular weight of the organosilicon polymer of the formula (1) is preferably 500–500,000. These organosilicon polymers are solid or liquid at the atmospheric temperature.

The method for producing the organosilicon polymer of the formula (1) includes, but are not limited to, dehydrogenation copolymerization of a diethynyl compound and a silane compound using a basic oxide, metal hydride, or a metal compound as a catalyst (Japanese Patent Applications Laid-open No. 7-90085, No. 10-120689, and No. 11-158187), a dehydrogenation polymerization method of an ethynyl silane compound using a basic oxide as a catalyst (Japanese Patent Applications Laid-open No. 9-143271), a method of reacting an organomagnesium reagent with a dichlorosilane (Japanese Patent Applications Laid-open No. 7-102069 and No. 11-029579), dehydrogenation copolymerization of a diethynyl compound and a silane compound using a cuprous chloride and tertiary amine as a catalyst (Hua Qin Liu and John F. Harrod, The Canadian Journal of Chemistry, Vol. 68, 1100–1105 (1990)), and dehydrogenation copolymerization of a diethynyl compound and a silane compound using magnesium oxide as a catalyst (Japanese Patent Applications Laid-open No. 7-90085 and No. 10-204181).

(B) Organic Solvent

The film-forming composition of the present invention is a solution or dispersion of the component (A) in an organic solvent (B).

As examples of the organic solvent (B), aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylebenzene, i-propylebenzene, diethylbenzene, i-butylbenzene, triethylbenzene, di-i-propylbenzene, and n-amylnaphthalene; monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketones such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclohexanone, 2-hexanone, methyl cyclohexanone, 2,4-pentane dione, acetonyl acetone, diacetone alcohol, acetophenone, and fenchone; ethers such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, N-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butylpropionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-dimethylformamide, acetamide, N-methylacetamide, N,N-dimethylacetamide, N-methylpropioneamide, and N-methylpyrrolidone; and and sulfur-containing solvents such as dimethyl sulfide, diethyl sulfide, thiophene, tetrahydrothiophene, dimethylsulfoxide, sulfolane, and 1,3-propanesultone can be given.

These solvents may be used either individually or in combination of two or more.

(C) Other Additives

The film-forming composition of the present invention may further comprise other components such as a curing promoter, colloidal silica, colloidal alumina, organic polymer, surfactant, silane coupling agent, and triazene compound.

The stopper for chemical mechanical planarization obtained in this manner is useful for fabrication of semiconductors such as LSI, system LSI, DRAM, SDRAM, RDRAM, and D-RDRAM due to its excellent resistance to CMP processing.

The polishing method using the stopper for chemical mechanical planarization of the present invention comprises, for example, forming the stopper for chemical mechanical planarization of the present invention on an insulating film on a substrate such as a silicon wafer, $SiO_2$ wafer, SiN wafer, SiC wafer, SiCO wafer, SiCN wafer, or SiCON wafer, producing openings, placing a metal for wiring on the stopper for chemical mechanical planarization or filling the openings with the metal for wiring, and removing unnecessary parts of the metal using a CMP solution.

As the insulating film, inorganic insulating films such as a polysiloxane film, polysilsesquioxane film, $CVD-SiO_2$ film, and CVD-carbon dope $SiO_2$ film can be given.

To form a stopper for chemical mechanical planarization on an insulating film, a coating solution of an organic polymer in an organic solvent is applied to the surface of the insulating film by a coating method such as spin coating, dipping, roll coating, or spraying.

A coated film with a dry thickness of about 0.02–1.5 µm is obtained by a single application, and about 0.04–3 µm by one further application. The coated film is then dried at an ordinary temperature or by heating at about 80–600° C. for 5–240 minutes, thereby forming the stopper for chemical mechanical planarization. A hot plate, oven, furnace, or the like can be used for heating the coated film in air, in nitrogen or argon, under vacuum, or under reduced pressure in which the oxygen concentration is controlled.

The stopper for chemical mechanical planarization can also be formed by irradiating ultraviolet rays or electron beams.

Next, openings are formed through the two-layer film consisting of the insulating film and the stopper for chemical mechanical planarization. A metal is then filled in the openings and layered over the stopper for chemical mechanical planarization.

As the metal layer, a laminate consisting of a first metal layer of a barrier metal such as titanium nitride (TiN), tantalum (Ta), or tantalum nitride (TaN) and a second metal layer of copper, an alloy containing copper as a major component, or a copper compound is usually used.

One embodiment of the present invention after forming the metal film is shown in FIG. 1.

Figure 2:
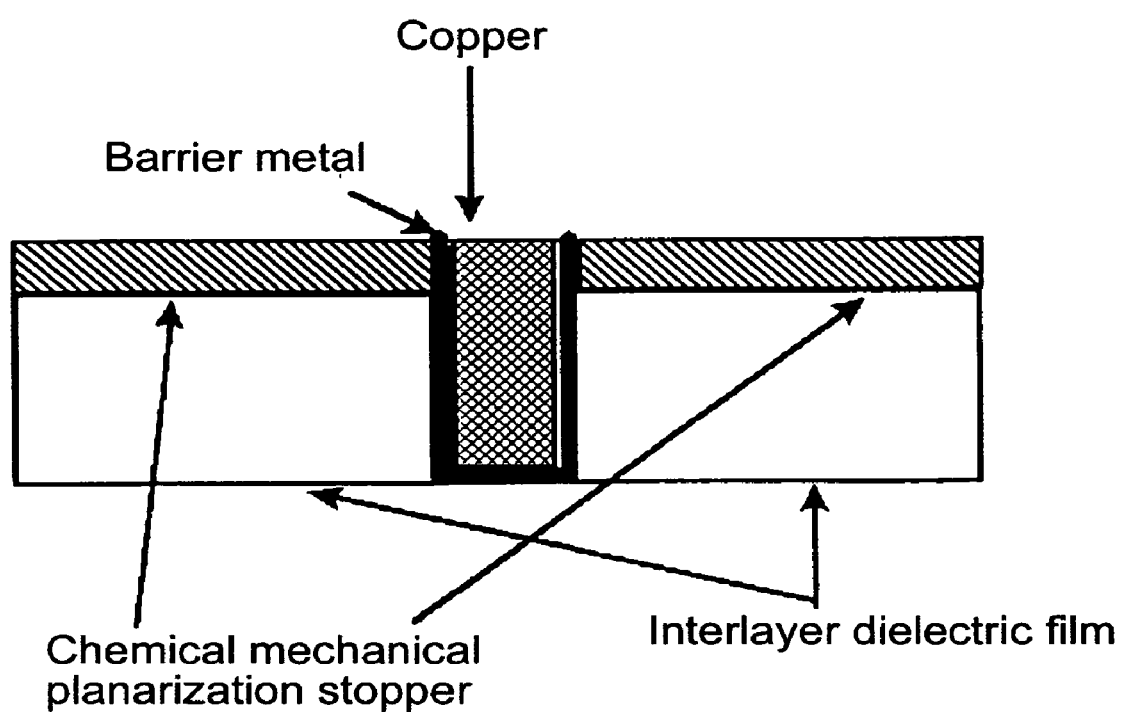
FIG. 2 shows the structure obtained by removing unnecessary metal by chemical mechanical planarization.

After forming the metal film, unnecessary metal is removed by the CMP process to obtain a structure shown in FIG. 2.

Any known polishing solution can be used for removing the metal film. The stopper for chemical mechanical planarization of the present invention is effective in suppressing reduction of scratching of the insulating film during a polishing operation using any polishing solution.

EXAMPLES

The present invention will be described in more detail by way of examples.

In the following examples and comparative examples, "parts" and "%" respectively refer to "parts by weight" and "wt %" unless otherwise indicated.

The film-forming compositions in the examples were evaluated using the following method.

Weight Average Molecular Weight (Mw)

Mw was measured by gel permeation chromatography (GPC) under the following conditions.

Samples: 1 g of the sample was dissolved in 100 cc of tetrahydrofuran.

Standard polystyrene: Standard polystyrene manufactured by Pressure Chemical Co. of the U.S. was used.

Apparatus: A high temperature high-speed gel osmosis chromatogram (Model 150-CALC/GPC™) manufactured by Waters Co. of the U.S.

Column: SHODEX A-80M™ (length: 50 cm) manufactured by Showa Denko K. K.

Temperature: 40° C.

Flow rate: 1 cc/min.

CMP Resistivity

The coated films were polished by the CMP method under the following conditions.

Slurry: silica-hydrogen peroxide

Polishing pressure: 400 g/cm$^2$

Polishing time: 180 seconds

After the CMP process, the change in the thickness of coated films was measured and the outward appearance of the surface was inspected using a 350,000 lux lamp. The films were rated according to the following standard.

O: The change in the film thickness was 2% or less and no scars nor peeled parts were observed on the film surface.

X: The change in the film thickness was more than 2% less and scars or peeled parts were observed on the film surface.

SYNTHESIS EXAMPLE 1

<Synthesis of Organosilicon Polymer>

Poly(phenylsilylene-ethynylene-1,3-phenylene-ethynylene) was dissolved in cyclohexanone to obtain a 15 wt % solution. This solution is referred to as "Solution (1)".

The solution (1) was filtered through a Teflon filter with 0.2 µm pore size to measure the relative dielectric constant of the coating film.

The relative dielectric constant was 3.0.

SYNTHESIS EXAMPLE 2

<Synthesis of Silicon Polymer>

77.04 g of methyltrimethoxysilane, 24.05 g of tetramethoxysilane, and 0.48 g of tetrakis(acetylacetonate) titanium were dissolved in 290 g of propylene glycol monopropyl ether in a separable glass flask. The solution was stirred using a three-one motor and the temperature of the liquid was stabilized at 60° C. Next, 84 g of ion exchanged water was added to the solution over one hour. After reacting the mixture for two hours at 60° C., 25 g of acetylacetone was added. The resulting mixture was reacted for 30 minutes and cooled to room temperature. 149 g of a solution containing methanol and water was removed by evaporation at 50° C. This solution is referred to as "Solution (2)".

The weight average molecular weight of the resulting hydrolysis condensate (either the hydrolyzate or its condensate or both) was 8,900.

EXAMPLE 1

The solution (2) obtained in the Synthesis Example 2 was coated onto an 8-inch silicon wafer by spin coating. The substrate was sintered for one minute on a hot plate at 100° C. and for 30 minutes at 420° C. in an oven in nitrogen atmosphere to obtain a substrate A. The coated film was adjusted to a thickness of 500 nm.

The solution (1) obtained in the Synthesis Example 1 was filtered through a Teflon filter with a pore diameter of 0.2 μm and coated onto the substrate A by spin coating to obtain a coated film with a thickness of 100 nm. The substrate was sintered for 2 minutes at 100° C. on a hot plate and for 30 minutes at 420° C. in an oven in a nitrogen atmosphere.

The CMP resistivity of the substrate was evaluated to confirm the change in the coated film thickness after the CMP process was 0.5%. Neither scars nor peelings were observed on the substrate after the CMP process.

COMPARATIVE EXAMPLE 1

The solution (2) obtained in the Synthesis Example 2 was filtered through a Teflon filter with a pore diameter of 0.2 μm and coated onto the substrate A by spin coating to obtain a coated film with a thickness of 100 nm. The substrate was sintered for 2 minutes at 100° C. on a hot plate and for 30 minutes at 420° C. in an oven in a nitrogen atmosphere.

The CMP resistivity of the substrate was evaluated to confirm the change in the coated film thickness after the CMP process was 0.8%. Scars and peelings were observed on the substrate after the CMP process.

A coating film (interlayer dielectric film material) for semiconductor with only minimal damages produced by the CMP process can be obtained by using the stopper for chemical mechanical planarization made from an organic polymer having a relative dielectric constant of 4 or less of the present invention.

What is claimed is:

1. A chemical mechanical planarization stopper film present on the surface of a substrate, consisting of
at least one polycarbosilane polymer consisting of structural units of the following formula (1),

wherein $R^1$ and $R^2$ independently represent a hydrogen atom, an alkyl group having 1–30 carbon atoms that may have a substituent, an alkenyl group having 1–30 carbon atoms that may have a substituent, an alkynyl group having 1–30 carbon atoms that may have a substituent, or an aromatic group that may have a substituent and $R^3$ represents —C≡C—, —CH$_2$— that may have a substituent linked with at least one —C≡C— group, an alkylene group having 2–30 carbon atoms that may have a substituent linked with at least one —C≡C— group, an alkenylene group having 2–30 carbon atoms that may have a substituent linked with at least one —C≡C— group, an alkynylene group having 2–30 carbon atoms that may have a substituent linked with at least one —C≡C— group, or a divalent aromatic group having 2–30 carbon atoms that may have a substituent linked with at least one —C≡C— group.

2. A two-layer film present on the surface of a substrate, comprising:
an insulating film directly in contact with the substrate, and
the chemical mechanical planarization stopper film according to claim 1.

3. The two-layer film according to claim 2, wherein the insulating film comprises at least one selected from the group consisting of a polysiloxane film, a polysisequioxane film, a CVD-SiO$_2$ film, and a CVD-carbon doped SiO$_2$ film.

4. The chemical mechanical planarization stopper film according to claim 1, having a thickness in the dried state of from 0.02 to 1.5 micron.

5. A substrate having a chemical mechanical planarization stopper film according to claim 1, present on a surface thereof, having a thickness of from 0.04 to 3 micron.

6. The chemical mechanical planarization stopper film according to claim 1, wherein the substrate is a wafer.

7. The chemical mechanical planarization stopper film according to claim 6, wherein the substrate is at least one selected from the group consisting of silicon, an SiO$_2$ wafer, an SiN wafer, an SiC wafer, an SiCO wafer, an SiCN wafer, and SiCON.

8. The chemical mechanical planarization stopper film according to claim 1, wherein the organosilicon polymer consists of polymerized units of –(phenylsilylene-ethynylene-1,3-phenylene-ethynylene.

* * * * *